United States Patent
Larnerd et al.

(10) Patent No.: US 7,211,289 B2
(45) Date of Patent: May 1, 2007

(54) METHOD OF MAKING MULTILAYERED PRINTED CIRCUIT BOARD WITH FILLED CONDUCTIVE HOLES

(75) Inventors: James M. Larnerd, Binghamton, NY (US); John M. Lauffer, Waverly, NY (US); Voya R. Markovich, Endwell, NY (US); Kostas I. Papathomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 79 days.

(21) Appl. No.: 10/737,974

(22) Filed: Dec. 18, 2003

(65) Prior Publication Data

US 2005/0136646 A1    Jun. 23, 2005

(51) Int. Cl.
*B05D 5/12* (2006.01)
*B28B 19/00* (2006.01)
*B29B 15/10* (2006.01)

(52) U.S. Cl. ............ 427/96.9; 427/97.2; 427/97.6; 427/97.7; 427/99.2

(58) Field of Classification Search .......... None
See application file for complete search history.

(56) References Cited

U.S. PATENT DOCUMENTS

| | | | |
|---|---|---|---|
| 4,642,160 A * | 2/1987 | Burgess | 216/18 |
| 6,015,520 A | 1/2000 | Appelt et al. | |
| 6,073,344 A | 6/2000 | Japp et al. | |
| 6,077,769 A * | 6/2000 | Huang et al. | 438/622 |
| 6,103,619 A * | 8/2000 | Lai | 438/638 |
| 6,188,027 B1 | 2/2001 | Miller et al. | |
| 6,211,485 B1 * | 4/2001 | Burgess | 219/121.7 |
| 6,214,716 B1 * | 4/2001 | Akram | 438/612 |
| 6,349,871 B1 | 2/2002 | Card, Jr. et al. | |
| 6,493,861 B1 | 12/2002 | Li et al. | |
| 6,626,196 B2 | 9/2003 | Downes, Jr. et al. | |
| 6,628,531 B2 | 9/2003 | Dadafshar | |
| 6,630,630 B1 | 10/2003 | Maezawa et al. | |
| 6,630,743 B2 | 10/2003 | Magnuson et al. | |
| 6,631,558 B2 * | 10/2003 | Burgess | 29/852 |
| 6,631,838 B2 | 10/2003 | Kim et al. | |
| 6,638,690 B1 | 10/2003 | Meier et al. | |
| 6,638,858 B2 | 10/2003 | Cheng | |
| 6,703,310 B2 * | 3/2004 | Mashino et al. | 438/666 |
| 7,091,124 B2 * | 8/2006 | Rigg et al. | 438/667 |
| 2002/0100613 A1 | 8/2002 | Anstrom et al. | |
| 2002/0108780 A1 | 8/2002 | Blackwell et al. | |
| 2002/0148637 A1 | 10/2002 | Anstrom et al. | |
| 2004/0163964 A1 * | 8/2004 | Egitto et al. | 205/125 |
| 2005/0104228 A1 * | 5/2005 | Rigg et al. | 257/786 |

* cited by examiner

*Primary Examiner*—David E. Graybill
(74) *Attorney, Agent, or Firm*—Hinman, Howard & Kattell, LLP; Lawrence R. Fraley

(57) ABSTRACT

A method of making a printed circuit board in which conductive thru-holes are formed within two dielectric layers of the board's structure so as to connect designated conductive layers. One hole connects two adjacent layers and the other connects two adjacent layers, including one of the conductive layers connected by the other hole. It is also possible to connect all three conductive layers using one or more holes. The resulting holes may be filled, e.g., with metal plating, or conductive or non-conductive paste. In the case of the latter, it is also possible to provide a top covering conductive layer over the paste, e.g., to serve as a pad or the like on the board's external surface.

10 Claims, 3 Drawing Sheets

METHOD OF MAKING MULTILAYERED PRINTED CIRCUIT BOARD WITH FILLED CONDUCTIVE HOLES

TECHNICAL FIELD

This invention relates to printed circuit boards and particularly to multilayered printed circuit boards having a plurality of conductive thru holes therein.

BACKGROUND OF THE INVENTION

In the manufacture of printed circuit boards, sometimes known as printed wiring boards, it has become commonplace to produce printed circuitry on both sides of a planar rigid or flexible insulating substrate. Of increased importance is the manufacture of multilayer printed circuits, the most common of boards sold today in view of increased operational demands for the products in which such boards are implemented. In these boards, the board typically consists of parallel, planar, alternating inner layers of insulating substrate material and conductive metal. The exposed outer sides of the laminated structure are provided with circuit patterns as with double-sided boards, and the metal inner layers typically contain circuit patterns, except in the case of internal power planes which are substantially solid, albeit also containing clearance openings or other openings if desired.

In double-sided and multilayer printed circuit boards, it is necessary to provide conductive interconnections between the various conductive layers or sides of the board. This is commonly achieved by providing metallized, conductive thru holes in the board which communicate with the sides and layers requiring electrical interconnection. For some applications, it is desired that electrical connection be made with almost if not all of the conductive layers. In such a case, thru-holes are also typically provided through the entire thickness of the board. For these, as well as other applications, it is often desired to also provide electrical connection between the circuitry on one face of the board and one or more of the inner circuit layers. In those cases, "blind vias", passing only part way through the board are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. For purposes of this application, the terms "conductive thru-hole" is meant to include both thru holes that pass entirely through the board (also referred to in the printed circuit field as plated thru holes or PTHs), "blind vias" which extend from an external surface of the board into a specified conductive layer of the board, as well as an "internal via" which is internal "captured" by the board's outer layers.

To provide the desired circuit pattern on the board, the art has developed a variety of manufacturing sequences, many of which fall into the broad categories of "subtractive" or "additive" techniques. Common to subtractive processes is the need to etch away (or subtract) metal to expose substrate surface in areas where no circuitry is desired. Additive processes, on the other hand, begin with exposed substrate surfaces (or thin commoning metallization layers for additive electroplate) and build up thereon of metallization in desired areas, the desired areas being those not masked by a previously-applied pattern of plating resist material (e.g., called photoresist in the printed circuit board field).

Typically, thru-holes are drilled (including mechanically or more recently using lasers) or punched into or through the board at desired locations. Drilling or punching provides newly-exposed surfaces including via barrel surfaces and via peripheral entry surfaces. The dielectric substrate, comprising a top surface, a bottom surface, and at least one exposed via hole surface, consisting partly or entirely of insulating material, is then metallized, generally by utilization of electroless metal depositing techniques, albeit other deposition processes are also known in the field.

In the manufacture of circuitized printed circuit boards, a dielectric sheet material is employed as the base component for the substrate. This base component typically is an organic material, such as fiberglass-reinforced epoxy resin (also referred to in the field as, simply, "FR4"), polytetrafluoroethylene (e.g., Teflon, a trademark of E.I. DuPont deNemours Company), Driclad (a trademark of Endicott Interconnect Technologies, Inc.), etc. Since the dielectric substrate is nonconductive, in order to plate on the substrate, the substrate is typically "seeded" and plating then occurs. Such processing is known in the field and further description is not believed necessary, except to add that known metals used for plating the dielectric barrel to form the thru holes include copper, nickel and gold.

Examples of methods of making boards, including providing same with such thru holes, are shown and described in the following U.S. Letters Patents:

| | |
|---|---|
| 6,015,520 | Method For Filling Holes in Printed Wiring Boards |
| 6,073,344 | Laser Segmentation of Plated Through-Hole Sidewalls To Form Multiple Conductors |
| 6,188,027 | Protection of a Plated Through Hole From Chemical Attack |
| 6,349,871 | Process For Reworking Circuit Boards |
| 6,493,861 | Interconnected Series of Plated Through Hole Vias and Method of Fabrication Therefor |
| 6,626,196 | Arrangement and Method For Degassing Small-High Aspect Ratio Drilled Holes Prior To Wet Chemical Processing |
| 6,628,531 | Multi-Layer and User-Configurable Micro-Printed Circuit Board |
| 6,630,630 | Multilayer Printed Wiring Board and Its Manufacturing Method |
| 6,630,743 | Copper Plated PTH Barrels and Methods For Fabricating |
| 6,631,558 | Blind Via Laser Drilling System |
| 6,631,838 | Method For Fabricating Printed Circuit Board |
| 6,638,690 | Method For Producing Multi-Layer Circuits |
| 6,638,858 | Hole Metal-Filling Method |

Additional examples of multilayered printed circuit boards are described and shown in the following published patents applications:

| | |
|---|---|
| US 2002/0100613 A1 | Conductive Substructures Of A Multilayered Laminate |
| US 2002/0108780 A1 | Multilayered Laminate |
| US 2002/0148637 A1 | High Performance Dense Wire For Printed Circuit Board |

The present invention represents a new and unique method of forming conductive thru holes in a printed circuit board in comparison to those above and other processes known in the art. It is believed that such a method, and the board resulting therefrom, will represent a significant advancement in the art.

DESCRIPTION OF THE INVENTION

It is, therefore, a primary object of the present invention to enhance the printed circuit board art by providing a new and unique method of producing such boards.

It is another object of the invention to provide such a process and resulting board in which several conductive thru holes are formed to interconnect various conductive layers of the board in a new and expeditious manner.

It is still another object of the invention to provide such a process which can be implemented using conventional printed circuit board technologies and thus performed with little or no increased cost over conventional techniques.

According to one aspect of the invention, there is provided a method of making a multilayered printed circuit board which comprises the steps of providing a first dielectric layer having first and second opposing sides, forming a first conductive layer on the first opposing side of the first dielectric layer and having an upper surface, forming a second conductive layer on the second opposing side of the first dielectric layer (the second conductive layer including at least one opening therein and having a top surface), forming a second dielectric layer having first and second opposing sides on the second conductive layer on the second opposing side of the first dielectric layer (the first opposing side of the second dielectric layer being in contact with at least part of the second conductive layer including over said at least one opening therein), forming at least two holes within the second dielectric layer, one of these holes extending down to the second conductive layer and the other of these holes extending through the at least one opening in said second conductive layer and down to the first conductive layer. The method further comprises the steps of forming a third conductive layer on the second opposing side of the second dielectric layer, and forming a conductive coating on the surfaces of the at least two holes so as to electrically couple the first and second conductive layers with the conductive coating on one of the holes and the second and third conductive layers with said conductive coating on the other of said holes.

According to another aspect of the invention, there is provided a multilayered printed circuit board comprising a first dielectric layer having first and second opposing sides, a first conductive layer positioned on the first opposing side of the first dielectric layer and having an upper surface, a second conductive layer positioned on the second opposing side of the first dielectric layer, the second conductive layer including at least one opening therein. The board further comprises a second dielectric layer having first and second opposing sides positioned on the second conductive layer on the second opposing side of said first dielectric layer, the first opposing side of the second dielectric layer being in contact with at least part of the second conductive layer including over the at least one opening therein, the second dielectric including at least two laser-formed holes therein. One of the laser-formed holes extends down to only the second conductive layer and the other laser-formed hole extends through the at least one opening in the second conductive layer and down to the first conductive layer. The board still further includes a third conductive layer positioned on the second opposing side of the second dielectric layer and a conductive coating positioned on the surfaces of the two laser-formed holes so as to electrically couple the first and second conductive layers with the conductive coating on one of the laser-formed holes and the second and third conductive layers with the conductive coating on the other of these laser-formed holes.

According to yet another aspect of the invention, there is provided a method of making a multilayered printed circuit board comprising forming a circuitized substrate having a first dielectric layer having opposing sides and first and second conductive layers on the first and second opposing sides, respectively, the second conductive layer including at least one opening therein, laminating a second dielectric layer onto the circuitized substrate such that the second dielectric layer substantially covers the second conductive layer; forming at least two holes within the second dielectric layer, one of these holes extending down to only the second conductive layer and the other of the holes extending through the at least one opening in the second conductive layer and down to the first conductive layer. A third conductive layer is formed on the second opposing side of the second dielectric layer and a conductive coating is formed on the surfaces of the at least two holes so as to electrically couple the first and second conductive layers with the conductive coating on one of the holes and the second and third conductive layers with the conductive coating on the other hole.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

Figure 1:
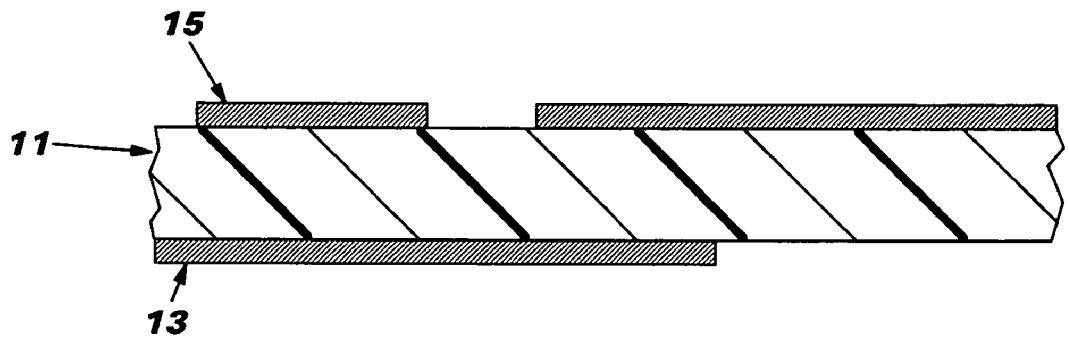
FIG. 1 is a side elevational view, in section, showing the initial steps in producing a printed circuit board according to one embodiment of the invention.

In FIG. 1, there is seen a structure which, as understood from the following, will represent a key element in a multi-layered printed circuit board in accordance with a preferred embodiment of the invention. The structure in FIG. 1, which may otherwise be referred to as a circuitized substrate, includes a first dielectric layer 11 formed of a conventional dielectric material such as fiberglass-reinforced polymer resin (also known as FR4), polytetrafluoroethylene (Teflon), (a trademark of E.I. duPont deNemours Company), Driclad (a trademark of Endicott Interconnect Technologies, Inc.), etc. In one embodiment, the dielectric layer 11 possessed a thickness within the range of from about 0.001 to about 0.005 inch. On a lower surface of layer 11 is a first conductive layer 13. In one example, layer 13 is copper and is preferably provided by laminating a conductive foil onto the dielectric layer 11 and thereafter circuitizing it using conventional photolithographic processing. Similarly, a second conductive layer 15 is provided on the upper, opposing surface of dielectric layer 11 in a similar manner. It is also possible to simultaneously form both conductive layers 13 and 15 using such photolithographic processing. As stated, because the structure shown in FIG. 1 possesses at least one conductive layer on a dielectric substrate, it may be referred to as a circuitized substrate.

Figure 2:
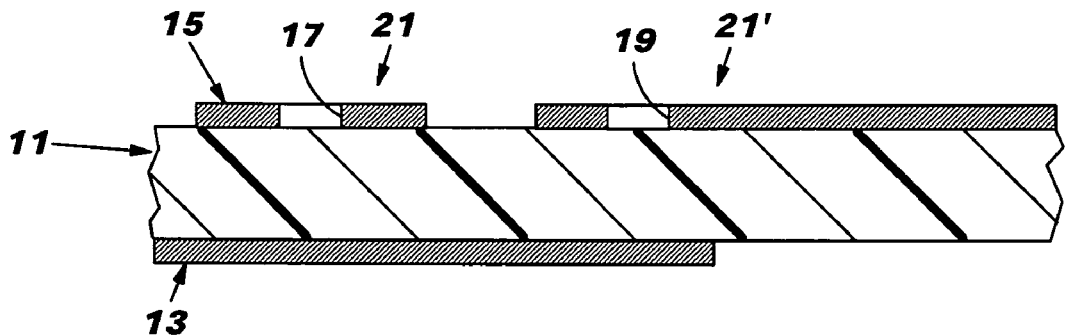
FIG. 2 is a side elevational view, in section, showing the step of providing at least two holes within a second conductive layer of the embodiment of FIG. 1.

In FIG. 2, a pair of openings 17 and 19 are provided within the upper conductive layer 15. These openings are preferably provided by etching using a suitable mask (not shown) and are preferably substantially cylindrical in shape. Further, the surrounding copper material of layer 15 may also be substantially cylindrical to thus represent a land or similar structure typically found in many printed circuit boards. The conductive layer 15 is shown in at least two separate, electrically isolated parts 21 and 21'. The first part 21 may be of the substantially cylindrical land configuration described hereinabove while the second part 21' may only include an end portion (that surrounding the opening 19). The remaining part of the conductive layer may represent a signal line or the like joined to the formed land.

Although two openings are shown as being provided in FIG. 2, it is to be understood that according to the broader aspects of this invention, it is only necessary to provide one such opening to still achieve the results desired herein.

Figure 3:
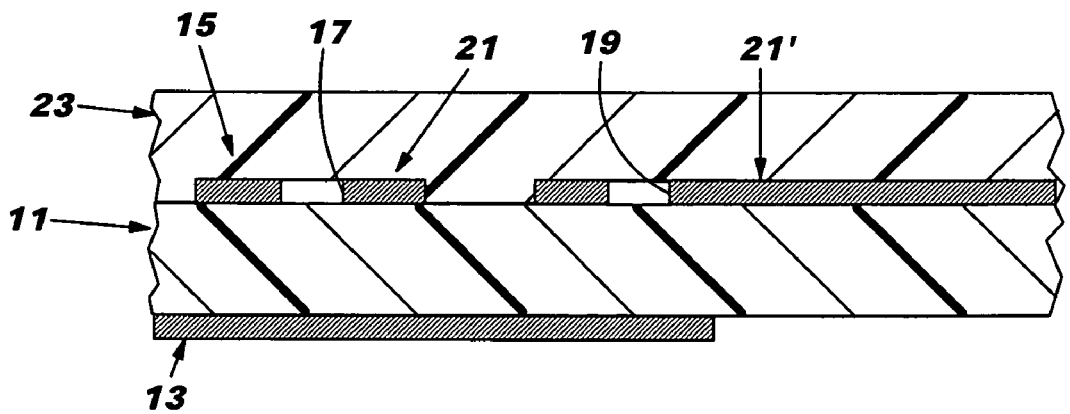
FIG. 3 is a side elevational view, in section, showing the step of adding a second dielectric layer to the embodiment of FIG. 2.

In FIG. 3, a second dielectric layer 23 is formed over the conductive layer 15 and onto the exposed surface of the first dielectric layer 11. As seen, the second dielectric layer 23 substantially covers the entire conductive layer 15, especially including the openings 17 and 19. The preferred method of forming layer 23 is to laminate it directly onto the FIG. 2 structure using conventional lamination processing. Further description is thus not believed necessary. Although no dielectric material from layer 23 is shown as being present within openings 17 and 19, this is for illustration purposes only in that such dielectric material will likely occur during a conventional laminating process and will have no effect on the subsequent processing defined herein. Although a single dielectric layer 23 is shown being applied in FIG. 3, it is possible to add what is known as a Resin-Coated Copper (REC) layer in which the dielectric was first coated onto a conductive layer (preferably copper) and this composite then applied, dielectric side first, as in FIG. 3. The copper will thus serve as another conductive (e.g., signal) layer for the final structure.

Figure 4:
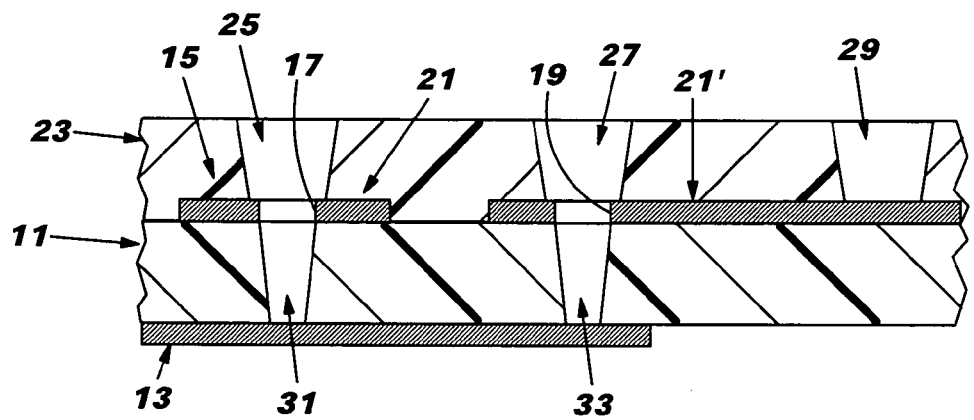
FIG. 4 is a side elevational view, in section, showing the step of forming at two holes (three are shown in FIG. 4) within the second dielectric layer applied in the embodiment shown in FIG. 3.

In FIG. 4, three holes 25, 27 and 29 are formed within the upper dielectric layer 23. These holes are formed using laser ablation in a manner known in the art and further description is not believed necessary, except to mention that in a preferred embodiment, an ultraviolet Nd:YAG laser was used. Additionally, a $CO^2$ or Excimer laser may also be used for such hole formation. Specifically, each of the holes 25, 27 and 29 extend, at a minimum, down to the upper surface of the conductive layer 15. See especially the hole 29 to the right in FIG. 4. Although three holes are shown as being formed, it is to be understood that according to the broad aspects of the invention, only two such holes need be provided. Three holes are shown in FIG. 4 and the subsequent FIGS. for illustration purposes and are not meant to limit the invention. As seen in FIG. 4, and in FIGS. 5–9, holes 25, 27 and 29 are of tapered configuration, including the lower portions of holes 25 and 27 which extend down to layer 13.

Significantly, in FIG. 4, the holes 25 and 27 have been formed directly in line with the openings 17 and 19 in layer 15, respectively. This is significant because the laser ablation during such hole formation will result in additional holes 31 and 33 being formed within the first dielectric layer 11. Thus, these lower holes are mere extensions of the above holes 25 and 27 to form a continuous, singular hole in these two parts of the structure of FIG. 4. Significantly, the openings 17 and 19, being formed in a metallic material (here, copper) substantially define the resulting configuration for the hole extensions 31 and 33 formed within layer 11. Thus, if the openings 17 and 19 are cylindrical, the corresponding holes 31 and 33 will also be substantially cylindrical and of a substantially similar diameter to that of the defining openings. Again, it is noted that no such subsequent holes are formed in layer 11 below the hole 29 to the right in FIG. 4, due to the presence of the solid metallic layer which limits the depth of the laser ablation occurring during hole formation.

It is to be understood that the steps defined in FIGS. 1–4 represent one embodiment of forming a printed circuit board according to the teachings herein. The invention is not limited to the immediate steps, in the order defined, in that additional steps may be utilized and/or substituted for those cited. This will be better understood with the following description of FIGS. 5–8.

Figure 5:
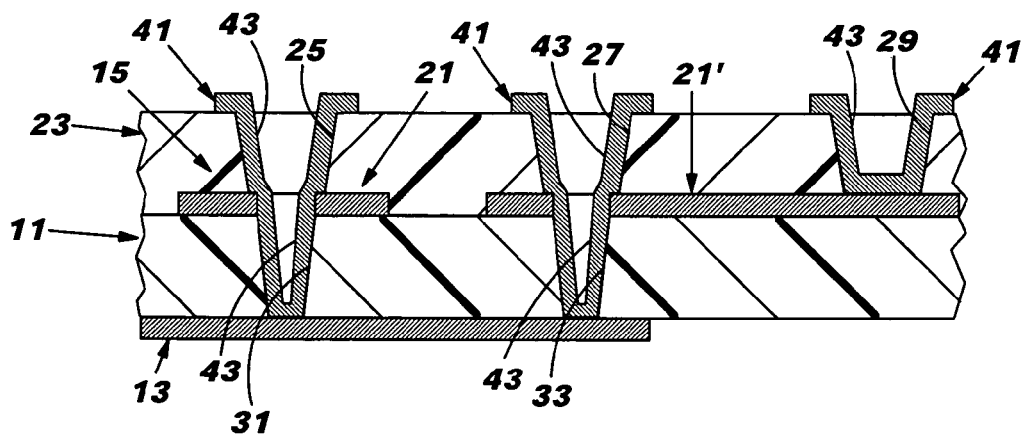
FIG. 5 is a side elevational view, in section, showing the application of a conductive layer onto the embodiment of FIG. 4 to provide selected interconnections between the various conductive layers which form part of this embodiment at this stage.

In FIG. 5, another conductive layer 41 has been formed on the upper surface of the second dielectric layer 23. In one embodiment, this upper conductive layer represents a series of lands of metallic material (e.g., copper) which are formed during the positioning of a conductive (copper) coating within the holes formed in the dielectric layers (and that in only layer 23) as shown. Preferably, such a conductive coating, illustrated by the numeral 43 in FIG. 5, is applied by either electroless or electrolytic copper plating, known plating processes in the art. Prior to such processing, it may be necessary to provide a "seed" layer on the dielectric surfaces for better copper adhesion. In one embodiment, a conductive coating 43 having a thickness of about 0.0003 to about 0.0015 inch was applied. In comparison, the corresponding thicknesses for the first and second conductive layers 13 and 15 are each within the range of about 0.0005 to about 0.003 inch. Similarly, the conductive lands 41 formed on the upper surface of dielectric layer 23 each preferably possess a thickness of from about 0.0003 to about 0.0015 inch.

Although it is mentioned above that a third conductive layer (here, 41) is formed and a conductive coating is applied during the processing shown in FIG. 5, it is again worth mentioning that these two elements (layer and coating) may be simultaneously formed to accomplish the desired results of the present invention. It must also be mentioned that a significant aspect of this invention is that the holes formed in the FIG. 4 embodiment which allows this subsequent simultaneous coating of both layers 11 and 23 are formed simultaneously using a singular laser operation. Thus, it is not necessary to provide initial laser ablation of one layer (i.e., 23) and then subsequently the other layer (i.e., 11). Such a second hole formation in FIG. 4 would most likely be necessary from the opposite (lower) surface of layer 11 and thus limitive in the formation of the printed circuit board according to the teachings herein (e.g., due to the presence of the desired conductive layer 13).

Of significance, the conductive thru holes formed in FIG. 5 serve to provide different connections in the resulting structure. For example, the thru hole to the left in FIG. 5 connects the upper conductive layer on dielectric layer 23 to the interim conductive layer 15 and subsequently to the lower conductive layer 13. This is also true for the conductive thru hole in the center of FIG. 5. In comparison, the conductive thru hole to the right in FIG. 5 only connects the upper conductive layer to the interim layer 15. It is thus seen in FIG. 5 that the thru holes as provided herein are capable of connecting three different conductive layers or just two, depending on operational requirements. It is further seen in FIG. 5 that the central thru hole connects the conductive planes 13, 15 and 41, the plane 15 at two locations (both thru holes to the right in FIG. 5). Thus, it is possible to connect the illustrated conductive planes in a multitude of ways, again depending on the operational requirements for the finished product (printed circuit board). Because the original holes to provide these connections were simultaneously formed in two different dielectric layers, coupled with this multiple connection capability, the resulting process and structure are capable of being provided in an expeditious manner and also represent a cost savings to the eventual product purchaser in comparison to many methods and structures of the prior art.

Figure 6:
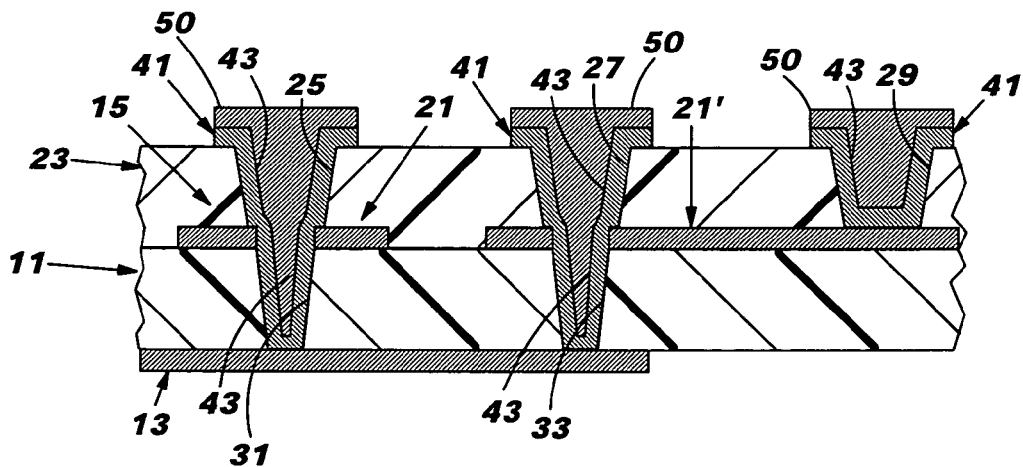
FIG. 6 is a side elevational view, in section, showing one example of filling the holes formed in FIG. 5, according to one embodiment of the invention.

In FIG. 6, a supplemental plating step results in substantially complete filling of the conductive thru holes formed in FIG. 5. This subsequent plating operation may also be an electroless or electrolytic plating operation and results in the substantial filling of the previously plated conductive thru holes in the manner shown. The preferred plating material is, again, copper. Conventional plating procedures were utilized during the electroless or electrolytic plating operations and further description is not believed necessary. Of significance, it is possible during this subsequent plating operation to provide a substantially solid upper surface 50 on each of the conductive thru holes which, as defined in FIG. 9, may serve to receive a solder ball or the like member as part of a chip carrier and/or may also be used to form subsequent connections to other, added layers to the structure shown in FIG. 6. In one embodiment, each of the substantially planar, solid upper surfaces 50 (which may be of slight thickness as depicted in FIG. 6 or lie flush to the upper surfaces of the lands 41) was to receive a solder ball from a laminate chip carrier such as a HyperBGA chip carrier sold by the assignee of the present invention. HyperBGA is a registered trademark of Endicott Interconnect Technologies, Inc.

Figure 7:
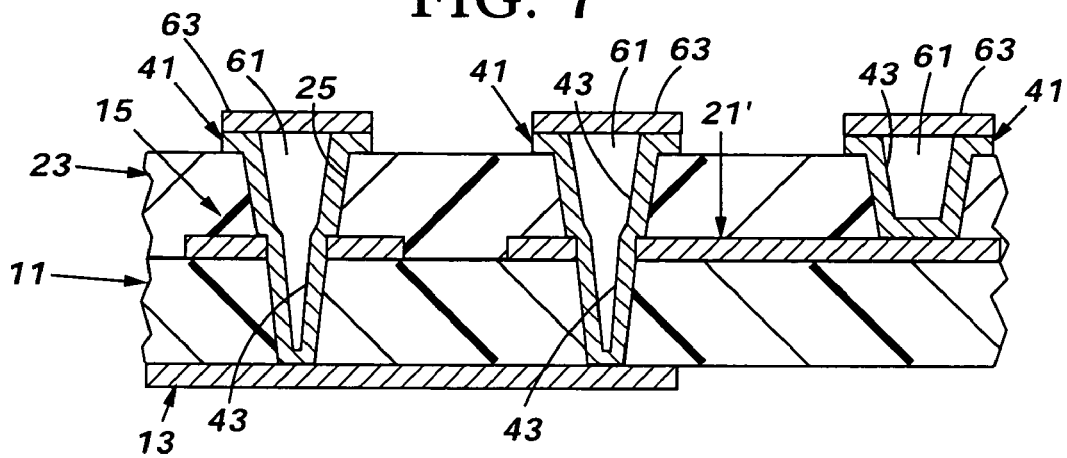
FIG. 7 is a side elevational view, in section, showing an alternative embodiment of filling the holes formed in the embodiment of FIG. 5 and of thereafter providing a conductive layer or cover thereover.

In FIG. 7, an alternative approach to filling the conductive thru holes is shown. In FIG. 7, each of the plated through holes is provided with a fill material of paste 61. Paste 61 may be conductive or non-conductive, depending on operational requirements. One example of a suitable conductive paste is CB100, available from duPont deNemours Company, located in Wilmington, Del. One example of a non-conductive paste suitable for use in the invention is particulate filled Dricad, available from Endicott Interconnect Technologies, Inc., located at 1701 North Street, Endicott, N.Y. Paste 61 is provided using a conventional paste dispenser and further description is not believed necessary. Following fill of paste 61, the paste serves as a support for a subsequent conductive layer 63 formed thereover. Layer 63 is preferably copper and is plated using electrolytic or electroless plating, and in one example, possesses a thickness of about 0.0001 to about 0.001 inch. This conductive layer 63 located on each of the illustrated conductive thru holes, also may serve to receive a solder ball or the like from holes, such as described above or may provide electrical connections to other parts of a larger circuit board structure, if utilized.

Figure 8:
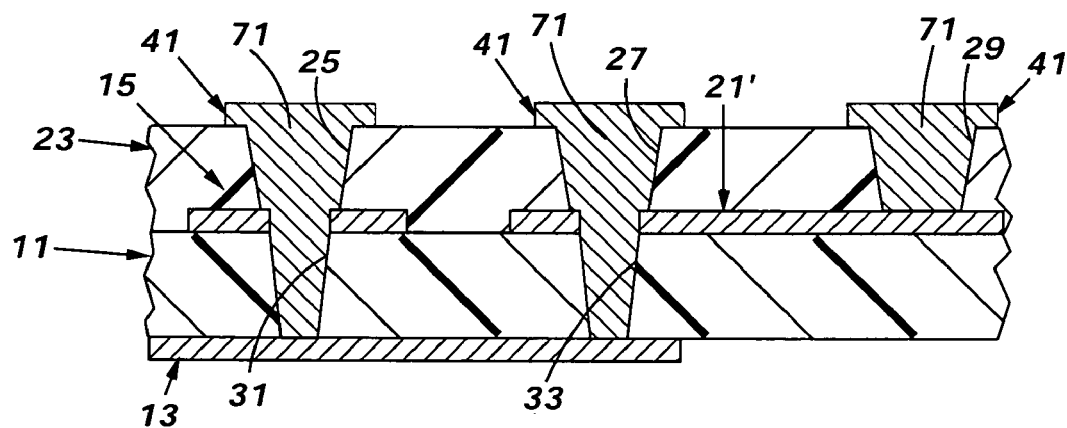
FIG. 8 is a side elevational view, in section, showing an alternative embodiment of filling the holes formed in the embodiment of FIG. 4.

FIG. 8 represents yet another embodiment for completely filling the holes formed in dielectric layers 11 and 23 to form a conductive thru hole capable of performing in the manner desired herein. In FIG. 8, a conductive material completely fills each of the formed holes, including the hole extensions in lower layer 11. This preferred material is copper and is provided using one of the aforementioned plating operations to substantially completely fill each of the holes as shown. The resulting solid (plug) structure also includes the substantially planar upper surface similar to the plated layer 63 in FIG. 7 and the upper surfaces 50 in FIG. 6. This substantially solid copper material material is represented by the numeral 71. Although copper is the preferred material for this embodiment of the invention, other metals may also be utilized, including Ni, Au, Pb, Sn and conductive paste such as CB100. The invention is thus not limited to copper for this aspect thereof. It is also worth mentioning that other conductive material may be used for the other conductive layers and even the conductive coating taught above, such alternative materials may include Ni, Au, Sn and Pb.

Figure 9:
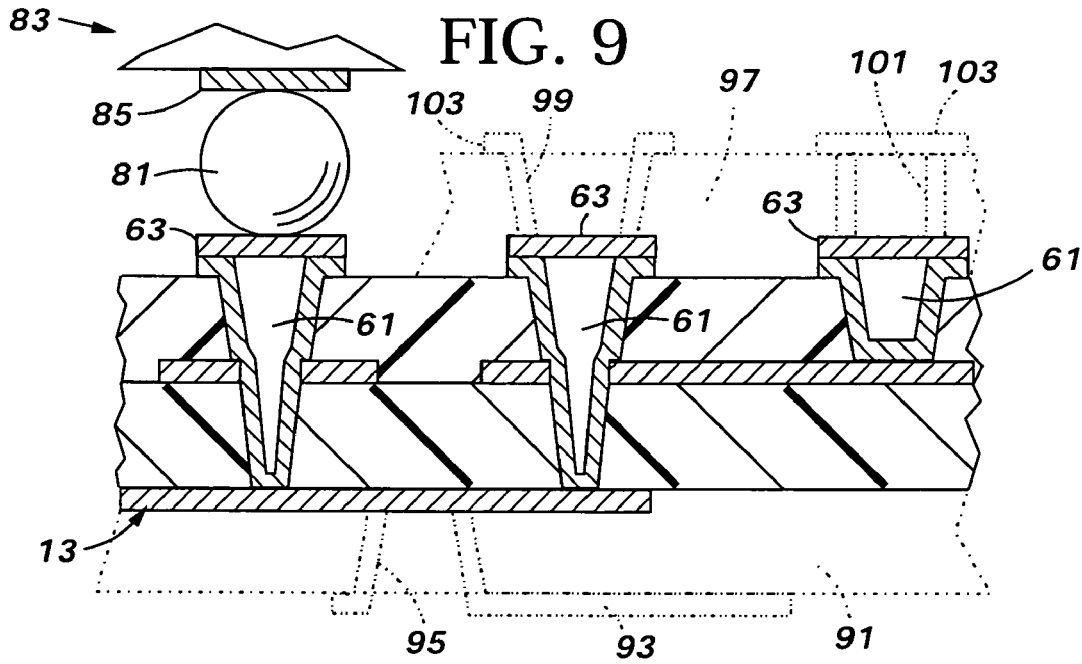
FIG. 9 is a side elevational view, in section, showing various alternative additional layers and conductive connections, i.e. vias, as well as possible additional electronic structures, i.e., a chip carrier, which may be added or coupled to the printed circuit board of the invention to provide a larger, more extended version thereof.

In FIG. 9, there is shown the printed circuit board structure formed in accordance with one embodiment of the invention wherein additional structure is provided and/or coupling has occurred to an external electronic component such as the aforementioned chip carrier. In FIG. 9, the conductive thru hole shown to the left is shown as being electrically coupled to a solder ball 81 which in turn is part of a laminate chip carrier 83 (only partially shown for illustration purposes), the solder ball 81 in turn connected to a conductive pad 85 which forms part of the carrier. In the preferred version, such a carrier will include several solder balls 81 and thus the circuit board defined herein is capable of being electrically coupled to selected ones (including all) of these solder balls to thus positively connect the chip carrier to the invention, resulting in a circuit board-electronic component assembly. In such a situation, the underlying conductive layer 13 will be in turn electrically coupled to other conductive layers which may be added to the circuit board or to other conductive parts of a structure (e.g., a server) into which the printed circuit board is positioned. One example of an additional dielectric layer and conductive plane is represented by the numerals 91 and 93 (both in phantom) in FIG. 9, with layer 93 coupled to layer 13 using a conductive thru hole 95 such as that provided using the teachings of the instant invention. Similarly, an additional dielectric layer 97 (also in phantom) may be provided in FIG. 9 and coupled to the plated through holes on the right side of the board (as shown) using a thru hole 99 (phantom) as formed herein or a conventional thru hole 101 (phantom). In either case, these upper conductive thru holes may in turn be electrically coupled to a surface conductive layer 103, either in the form of a land or continuous signal line.

Although the FIG. 9 embodiment shows the use of a paste fill 61 in the conductive thru holes, this is not meant to limit the invention in that the conductive thru holes may possess any of the cross-sectional constructions shown herein, including those in FIGS. 6 and 8. It is also possible, within the broader aspects of the invention, to directly couple a solder ball to the upper land configurations depicted in FIG. 5, these lands not including a plated or solid conductive layer bridging thereacross.

Thus there has been shown and described a new and unique printed circuit board and method of making same in which holes are simultaneously provided through two or more dielectric layers of the structure and various individual layers may be coupled in a multitude of ways, depending on the design requirements for the finished product. The invention thus represents a significant improvement in the art.

While there have been shown and described what are at present the preferred embodiments of the invention, it will be obvious to those skilled in the art that various changes and modifications may be made therein without departing from the scope of the invention as defined by the appended claims. For example, the present invention has been defined in a context in which the formed resulting structure may serve as a base for subsequently applied dielectric and/or conductive layers to build a larger, final structure. This is not meant to limit the invention. It is entirely possible to initially provide an already formed circuitized substrate (PCB) and build the present invention onto same. For example, the lower conductive layer 13 in FIG. 1 could be the top conductive layer of such an earlier formed substrate and the remaining parts of the instant invention then applied thereover to provide this initial substrate with the advantageous features taught herein.

What is claimed is:

1. A method of making a multilayered printed circuit board, said method comprising:
   providing a first dielectric layer having first and second opposing sides;
   forming a first conductive layer on said first opposing side of said first dielectric layer;
   forming a second conductive layer on said second opposing side of said first dielectric layer, said second conductive layer including at least one opening therein;
   forming a second dielectric layer having first and second opposing sides on said second conductive layer on said second opposing side of said first dielectric layer, said first opposing side of said second dielectric layer being in contact with at least part of said second conductive layer including over said at least one opening therein;
   forming first and second holes within said second dielectric layer using a laser, said first hole extending down to only said second conductive layer and a part of said second hole extending through said at least one opening in said second conductive layer and down to said first conductive layer, said first and second holes, including said part of said second hole extending through said at least one opening in said second conductive layer and down to said first conductive layer, each being of tapered configuration and having surfaces;
   forming a third conductive layer on said second opposing side of said second dielectric layer;
   forming a conductive coating on said surfaces of said first and second holes so as to electrically couple said first and second conductive layers with said conductive coating on said second hole and said second and third conductive layers with said conductive coating on said first hole;
   plating said first and second holes having said conductive coatings thereon with plating material to fill said first and second holes, including said part of said second hole extending through said at least one opening in said second conductive layer and down to said first conductive layer; and
   forming a substantially solid upper surface on said conductive material within each of said first and second holes.

2. The method of claim 1 wherein said conductive coating on said second hole also electrically couples said second conductive layer and said third conductive layer.

3. The method of claim 1 wherein said first, second and third conductive layers are formed using photolithographic processing.

4. The method of claim 1 wherein said conductive coatings are formed on said surfaces of each of said holes using a plating process.

5. The method of claim 1 wherein said second dielectric layer is formed on said second conductive layer using a laminating process.

6. A method of making a multilayered printed circuit board, said method comprising:
   providing a first dielectric layer having first and second opposing sides;
   forming a first conductive layer on said first opposing side of said first dielectric layer;
   forming a second conductive layer on said second opposing side of said first dielectric layer, said second conductive layer including at least one opening therein;
   forming a second dielectric layer having first and second opposing sides on said second conductive layer on said second opposing side of said first dielectric layer, said first opposing side of said second dielectric layer being in contact with at least part of said second conductive layer including over said at least one opening therein;
   forming first and second holes within said second dielectric layer using a laser, said first hole extending down to only said second conductive layer and a part of said second hole extending through said at least one opening in said second conductive layer and down to said first conductive layer, said first and second holes, including said part of said second hole extending through said at least one opening in said second conductive layer and down to said first conductive layer, each being of tapered configuration and having surfaces;
   forming a third conductive layer on said second opposing side of said second dielectric layer;
   forming a conductive coating on said surfaces of said first and second holes so as to electrically couple said first and second conductive layers with said conductive coating on said second hole and said second and third conductive layers with said conductive coating on said first hole;
   filling said first and second holes having said conductive coatings thereon with conductive paste, including said part of said second hole extending through said at least one opening in said second conductive layer and down to said first conductive layer; and
   forming a conductive layer over said conductive paste within each of said first and second holes.

7. The method of claim 6 wherein said conductive coating on said second hole also electrically couples said second conductive layer and said third conductive layer.

8. The method of claim 6 wherein said first, second and third conductive layers are formed using photolithographic processing.

9. The method of claim 6 wherein said conductive coatings are formed on said surfaces of each of said holes using a plating process.

10. The method of claim 6 wherein said second dielectric layer is formed on said second conductive layer using a laminating process.

* * * * *